(12) United States Patent
Chen et al.

(10) Patent No.: US 8,174,636 B2
(45) Date of Patent: May 8, 2012

(54) THIN FILM TRANSISTOR SUBSTRATE AND LIQUID CRYSTAL DISPLAY HAVING THE SAME COMPRISING A COUPLING CAPACITOR AS A VOLTAGE DIVIDER BETWEEN A TFT AND A DATA LINE

(75) Inventors: Chien-Cheng Chen, Miao-Li (TW); Hung-Yu Chen, Miao-Li (TW); Yu-Cheng Lin, Miao-Li (TW); Wen-Ming Hung, Miao-Li (TW); Yung-Hsun Wu, Miao-Li (TW); Chueh-Ju Chen, Miao-Li (TW); Ying-Tsung Lin, Miao-Li (TW)

(73) Assignee: Chimei Innolux Corporation, Miaoli County (TW)

( * ) Notice: Subject to any disclaimer, the term of this patent is extended or adjusted under 35 U.S.C. 154(b) by 664 days.

(21) Appl. No.: 12/228,397

(22) Filed: Aug. 11, 2008

(65) Prior Publication Data

US 2009/0040413 A1 Feb. 12, 2009

(30) Foreign Application Priority Data

Aug. 10, 2007 (CN) .......................... 2007 1 0075662

(51) Int. Cl.
*G02F 1/136* (2006.01)
*G02F 1/1343* (2006.01)
(52) U.S. Cl. .......................................... 349/48; 349/38
(58) Field of Classification Search .................... 349/38, 349/39, 41, 48, 143
See application file for complete search history.

(56) References Cited

U.S. PATENT DOCUMENTS

| 7,016,001 | B2 | 3/2006 | Tanaka et al. | |
|---|---|---|---|---|
| 7,576,720 | B2 | 8/2009 | Lin et al. | |
| 7,688,393 | B2 | 3/2010 | Ueda et al. | |
| 2005/0030460 | A1 | 2/2005 | Kim et al. | |
| 2007/0120797 | A1* | 5/2007 | Lin et al. | 345/92 |
| 2008/0088783 | A1* | 4/2008 | Tai et al. | 349/129 |
| 2008/0158464 | A1* | 7/2008 | Chang et al. | 349/48 |

FOREIGN PATENT DOCUMENTS

| CN | 1573486 A | 2/2005 |
|---|---|---|
| CN | 1719321 A | 1/2006 |
| CN | 1773355 A | 5/2006 |
| CN | 1866087 A | 11/2006 |
| KR | 10-2008-0059864 A | 7/2008 |

* cited by examiner

*Primary Examiner* — Mark Robinson
*Assistant Examiner* — Paul Lee
(74) *Attorney, Agent, or Firm* — Bacon & Thomas, PLLC

(57) ABSTRACT

An exemplary thin film transistor (TFT) substrate assembly includes a substrate, a plurality of gate lines disposed on an inner surface of the substrate, a plurality of data lines disposed insulated with the gate lines. The plurality of gate lines and the plurality of data lines define a plurality of pixel regions. Each pixel region includes a first switch element, a second switch element, a first pixel electrode, and a second pixel electrode. The first switch element and the second switch element are connected with a same gate line from the plurality of gate lines. The first pixel electrode is applied with data signals from a data line from the plurality of data lines via the first switch element. The second pixel electrode is applied with data signals from the data line from the plurality of data lines via the second switch element and a voltage dividing element.

9 Claims, 14 Drawing Sheets

THIN FILM TRANSISTOR SUBSTRATE AND LIQUID CRYSTAL DISPLAY HAVING THE SAME COMPRISING A COUPLING CAPACITOR AS A VOLTAGE DIVIDER BETWEEN A TFT AND A DATA LINE

CROSS-REFERENCE TO RELATED APPLICATION

This application is related to, and claims the benefit of, a foreign priority application filed in China as Serial No. 200710075662.5 on Aug. 10, 2007. The related application is incorporated herein by reference.

FIELD OF THE INVENTION

Embodiments of the present disclosure relate to thin film transistor (TFT) substrate assemblies, and more particularly to a TFT substrate assembly in a liquid crystal display.

BACKGROUND OF THE INVENTION

An LCD has the advantages of portability, low power consumption, and low radiation, and has been widely used in various portable information products such as notebook computers, personal digital assistants (PDAs), video cameras, for example. A conventional LCD such as a twisted nematic (TN) LCD commonly has a rather limited viewing angle. Thus, a multi-domain vertical alignment (MVA)-type LCD was developed to improve the viewing angle.

Referring to FIG. 18, one such MVA-type LCD is shown. The LCD 100 includes a first substrate assembly (not shown), a second substrate assembly 111 generally facing the first substrate assembly, and a liquid crystal layer (not labeled) positioned between the first substrate assembly and the second substrate assembly 111. The liquid crystal layer includes a plurality of liquid crystal molecules 131.

The first substrate assembly includes a common electrode (not shown), and a plurality of first protrusions 119 arranged in that order from top to bottom. The first protrusions 119 are arranged along a plurality of V-shaped paths. The second substrate assembly 111 includes a plurality of gate lines 122, a plurality of first data lines 123, a plurality of second data lines 124, a plurality of common lines 121, a plurality of first pixel electrodes 127, a plurality of second pixel electrodes 128, and a plurality of second protrusions 129. The second protrusions 129 and the first protrusions 119 are arranged alternately.

Every adjacent first data line 123 and second data line 124, and every two adjacent common lines 121 together define a pixel region 10. The gate lines 122 locate crossing the pixel regions 10, and divide each pixel region 10 into a first sub-pixel region 101 and a second sub-pixel region 102.

In the first sub-pixel region 101, a first TFT 125 connects the first pixel electrode 127 with one of the plurality of first data lines 123. The one of the plurality of first data lines 123 provides a plurality of first gray-scale voltages to the first pixel electrode 127. In the second sub-pixel region 102, a second TFT 126 connects the second pixel electrode 128 with one of the plurality of second data lines 124. The one of the plurality of second data lines 124 provides a plurality of second gray-scale voltages to the second pixel electrode 128.

Referring also to FIG. 19, in the first sub-pixel region 101 in each frame, when a first gray-scale voltage is applied to the first pixel electrode 127, and a common voltage is applied to the common electrode, an electric field is generated therebetween. The liquid crystal molecules 131 in the first sub-pixel region 101 twist according to the electric field. The liquid crystal molecules 131 are guided by the protrusions 119, 129 and thereby become aligned in four different directions. Thus four domains are defined according to the protrusions 119, 129. Similarly, in the second sub-pixel region 102 in the same frame, when a second gray-scale voltage is applied to the second pixel electrode 128, and a common voltage is applied to the common electrode, other four domains are defined according to the protrusions 119, 129.

Referring also to FIG. 20, because the voltages of the first pixel electrode 127 is different from the voltage of the second pixel electrode 128 in each frame, a tilt angle $\theta_1$ of the liquid crystal molecules 131 in the first sub-pixel region 101 is different from a tilt angle $\theta_2$ of the liquid crystal molecules 131 in the second sub-pixel region 102. Thus, a total of eight domains are defined in each pixel region 10.

However, each pixel region 10 needs a first data line 123 and a second data line 124 for the LCD device 100 to be able to achieve 8-domain vertical alignment. The layout of the first data line 123 and the second data line 124 is complicated, resulting in a reduction of an aperture ratio of the LCD 100. Furthermore, the cost of the LCD 100 is correspondingly increased.

It is desired to provide an improved LCD which can overcome the above-described deficiencies.

SUMMARY

In one embodiment, a thin film transistor (TFT) substrate assembly includes a substrate, a plurality of gate lines disposed on an inner surface of the substrate, a plurality of data lines disposed insulated with the gate lines. The plurality of gate lines and the plurality of data lines define a plurality of pixel regions. Each pixel region includes a first switch element, a second switch element, a first pixel electrode, and a second pixel electrode. The first switch element and the second switch element are connected with a same gate line from the plurality of gate lines. The first pixel electrode is applied with data signals from a data line from the plurality of data lines via the first switch element. The second pixel electrode is applied with data signals from the data line from the plurality of data lines via the second switch element and a voltage dividing element.

Other novel features and advantages will become more apparent from the following detailed description when taken in conjunction with the accompanying drawings. In the drawings, all the views are schematic.

DETAILED DESCRIPTION OF CERTAIN INVENTIVE EMBODIMENTS

Reference will now be made to the drawings to describe certain inventive embodiments of the present disclosure in detail.

Figure 1:
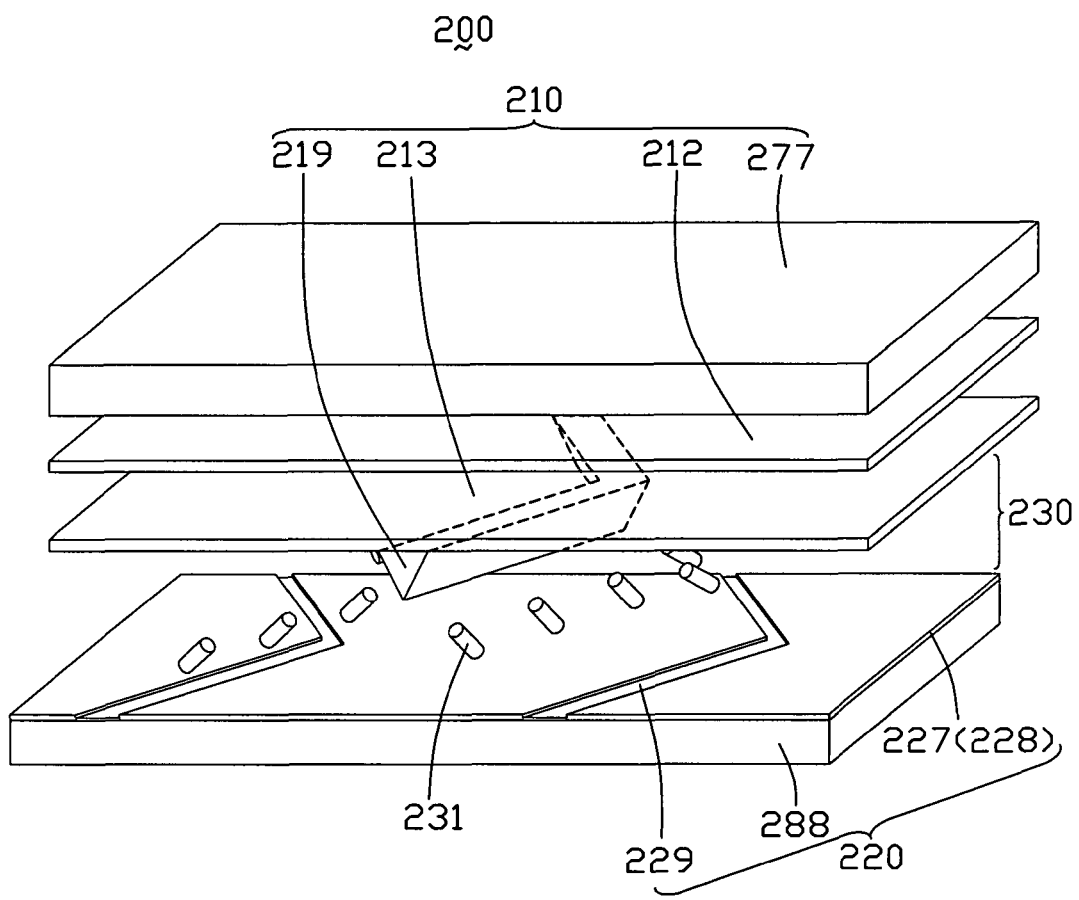
FIG. 1 is an exploded, isometric view of an LCD according to one embodiment of the present disclosure, the LCD including one embodiment of a TFT substrate assembly and a plurality of liquid crystal molecules.

Referring to FIG. 1, an LCD 200 according to one embodiment of the present disclosure includes a color filter substrate assembly 210, a TFT substrate assembly 220 parallel to the color filter substrate assembly 210, and a liquid crystal layer 230 positioned between the two substrate assemblies 210, 220. The liquid crystal layer 230 includes a plurality of liquid crystal molecules 231.

The color filter substrate assembly 210 includes a first transparent substrate 277, a color filter 212, a common electrode 213, and a plurality of first protrusions 219 arranged from top to bottom respectively. The color filter 212 includes a plurality of red filter units (not shown), a plurality of green filter units (not shown), and a plurality of blue filter units (not shown). The first protrusions 219 are parallel to one another, having a triangular section configuration, and are arranged along a plurality of V-shaped paths.

Figure 2:
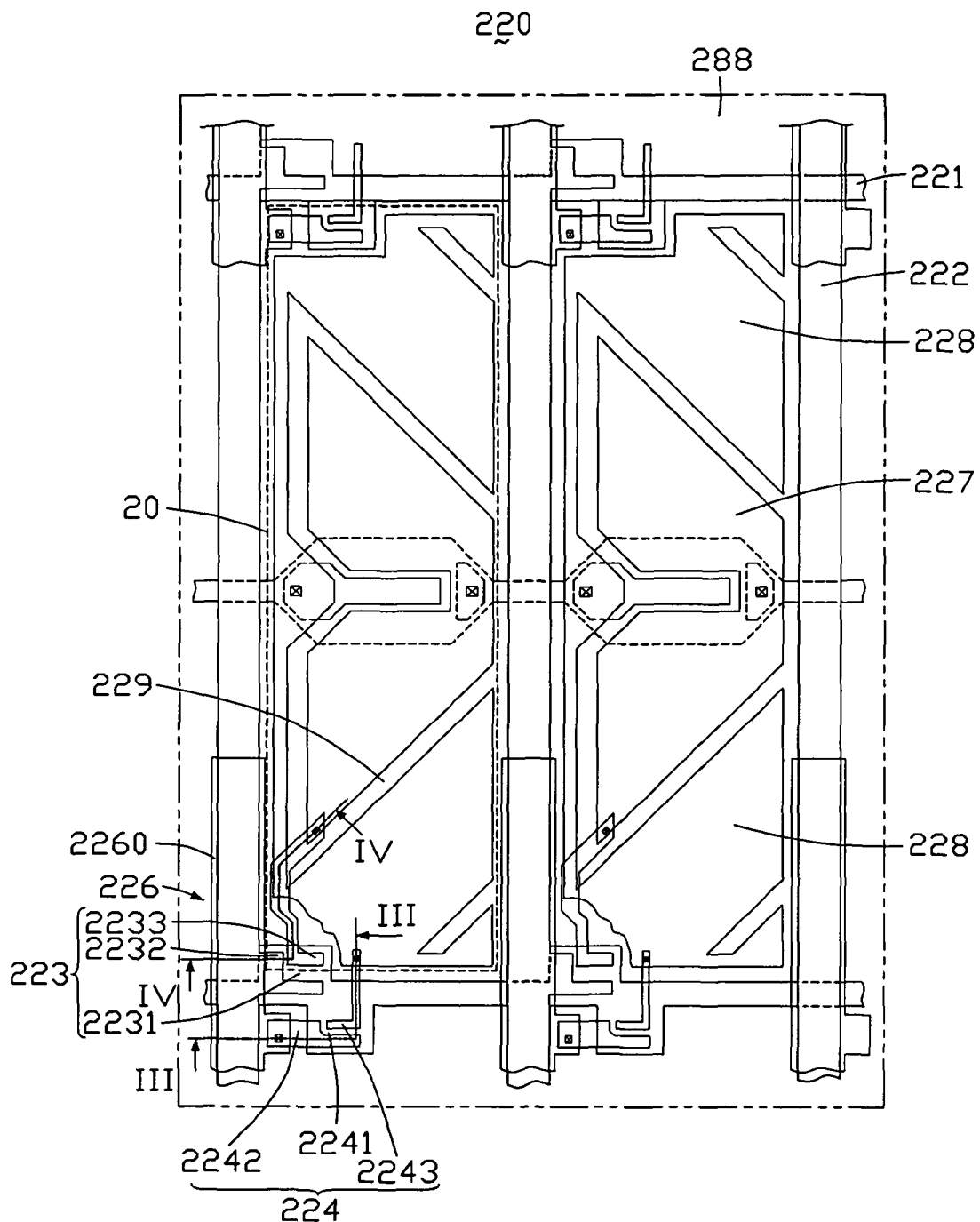
FIG. 2 is a top plan view of one embodiment of the TFT substrate assembly of the LCD of FIG. 1, defining a plurality of pixel regions, each pixel region being divided into a first sub-pixel unit and a second sub-pixel unit.

Referring also to FIG. 2, the TFT substrate assembly 220, in one embodiment, includes a second transparent substrate 288, a plurality of parallel gate lines 221 that each extends along a first direction, a plurality of parallel data lines 222 that each extend along a second direction that is orthogonal to the first direction, a plurality of first pixel electrodes 227, and a plurality of second pixel electrodes 228. The gate lines 221 are insulated from the data lines 222 by a passivation layer (not shown).

Every two adjacent gate lines 221 and every two adjacent data lines 222 cooperatively form a rectangular area defined as a pixel region 20. Each of the pixel region 20 corresponds to a filter unit of the color filter 212. Each of the pixel region 20 includes a first TFT 223 and a second TFT 224 disposed in a vicinity of an intersection between the gate line 221 and the data lines 222. The first TFT 223 includes a first gate electrode 2231, a first source electrode 2232, and a first drain electrode 2233. The second TFT 224 includes a second gate electrode 2241, a second source electrode 2242, and a second drain electrode 2243. The first gate electrode 2231 and the second gate electrode 2241 are both connected with the gate line 221. The first drain electrode 2233 is connected with the first pixel electrode 227. The first source electrode 2242 is connected with the data line 222. The second drain electrode 2243 is connected with the second pixel electrode 228. The second source electrode 2242 is connected with the data line 222 via a coupling capacitor 226. The first pixel electrode 227 and the second pixel electrode 228 cooperatively define a plurality of slits 229. The slits 229 are arranged along a plurality of V-shaped paths and are arranged alternately with the protrusions 219.

Figure 3:
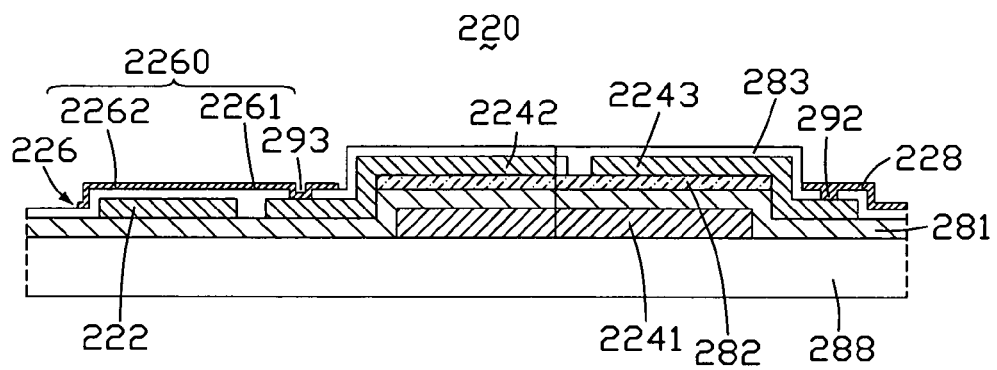
FIG. 3 is a schematic, side view of one embodiment of the TFT substrate assembly taken along line III-III of FIG. 2.
Figure 4:
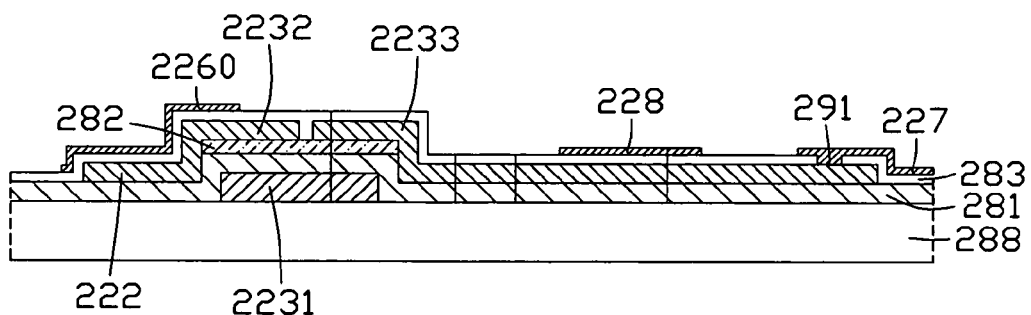
FIG. 4 is a schematic, side view of one embodiment of the TFT substrate assembly taken along line IV-IV of FIG. 2.

Referring also to FIG. 3 and FIG. 4, the TFT substrate assembly 220, in one embodiment, further includes a gate insulating layer 281, a patterned semi-conductor layer 282, and a passivation layer 283. The first gate electrode 2231, the second gate electrode 2241, and the gate lines 221 are disposed on the second transparent substrate 288. The gate insulating layer 281 is disposed on the first gate electrode 2231 and the second gate electrode 2241, the gate lines 221, and the second transparent substrate 288. The semi-conductor layer 282 is disposed on the gate insulating layer 281. The source electrodes 2232, 2242 and the drain electrodes 2233, 2243 are disposed on the semi-conductor layer 282 and the gate insulating layer 281. The data lines 222 are disposed on the gate insulating layer 281. The passivation layer 283 is disposed on the data lines 222, the gate insulating layer 281, the source electrodes 2232, 2242 and the drain electrodes 2233, 2243.

The first pixel electrode 227 is connected with the first drain electrode 2233 via a first connecting hole 291. The second pixel electrode 228 is connected with the second drain electrode 2243 via a second connecting hole 292. The first source electrode 2232 is connected with the data line 222. The coupling capacitor 226 includes a coupling electrode 2260. The coupling electrode 2260 is divided into a first part 2261 and a second part 2262. The first part 2261 of the coupling electrode 2260 is connected with the first source electrode 2242 via a third connecting hole 293 in the passivation layer 283. The second part 2262 of the coupling electrode 2260 overlaps with the data line 222. The second part 2262, a corresponding part of the data line 222, and the passivation layer 283 cooperatively form the coupling capacitor 260.

The gate line 221, the first gate electrode 2231 and the second gate electrode 2241 are formed by a same opaque metal layer. The first source electrode 2232, the first drain electrode 2233, the second source electrode 2242, the second drain electrode 2243, and the data line 222 are formed by another same opaque metal layer. Depending on the embodiment, the metal layer can be made from one or more elements comprising aluminum (Al), molybdenum (Mo), chromium (Cr), tantalum (Ta), and copper (Cu). The first pixel electrode 227, the second pixel electrode 228, and the coupling electrode 2260 are formed by a transparent conductive film disposed in a same manufacture process. In one embodiment, the transparent conductive film can be made from indium tin oxide (ITO) or indium zinc oxide (IZO).

Figure 5:
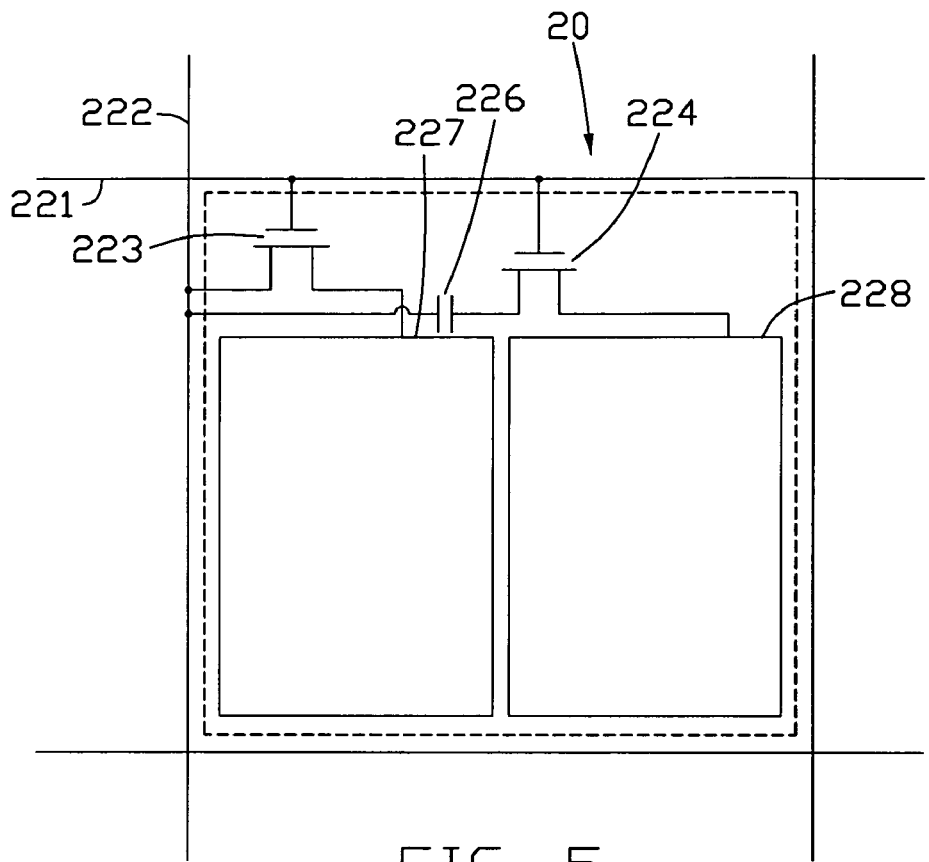
FIG. 5 is a circuit diagram illustrating one embodiment of the pixel regions of FIG. 2.

The first source electrode 2232 is directly connected with the data line 222 such that a voltage of the first pixel electrode 227 is substantially equal to a voltage of the data line 222. The second source electrode 2242 is connected with the data line 222 via the coupling capacitor 226. The coupling capacitor 226 generates a voltage drop across the coupling capacitor 226 such that a voltage of the second pixel electrode 228 is less than the voltage of the data line 222. Therefore, the voltage of the first pixel electrode 227 is different from the voltage of the second pixel electrode 228. FIG. 5 illustrates a circuit diagram of one embodiment one of the pixel units 20 of the LCD 200.

Figure 6:
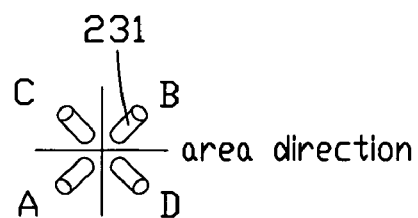
FIG. 6 is a top-down view of orientations of one embodiment of four of the liquid crystal molecules in the first sub-pixel region or the second sub-pixel region of FIG. 2.
Figure 7:
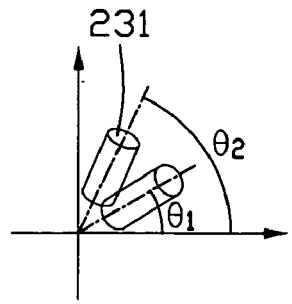
FIG. 7 is a schematic, side view of one embodiment of one of the liquid crystal molecules in the first sub-pixel region and one of the liquid crystal molecules in the second sub-pixel region of FIG. 2, the liquid crystal molecules having different tilt angle.

Referring also to FIG. 6 and FIG. 7, a top-down view and a side view of one embodiment of orientations of certain of the liquid crystal molecules 231 in the pixel unit 20 of FIG. 5 are shown. When corresponding voltages are applied to the first pixel electrode 227, the second pixel electrode 228 and the common electrode 213, electric fields are generated between the first pixel electrode 227 and the common electrode 213 as well as between the second pixel electrode 228 and the common electrode 213. The liquid crystal molecules 231 twist according to the electric fields. The liquid crystal molecules 231 are guided by the protrusions 219 and the slit 229, thus being aligned in four different directions. Accordingly four domains are defined.

Because the voltage of the first pixel electrode 227 is different from the voltage of the second pixel electrode 228 in each frame, tilt angle $\theta_1$ of the liquid crystal molecules 231 corresponding to the first pixel electrode 227 is different from tilt angle $\theta_2$ of the liquid crystal molecules 231 corresponding to the second pixel electrode 228. Thus, a total of eight domains are defined in the pixel unit 20. The LCD 200 achieves 8-domain vertical alignment.

Figure 8:
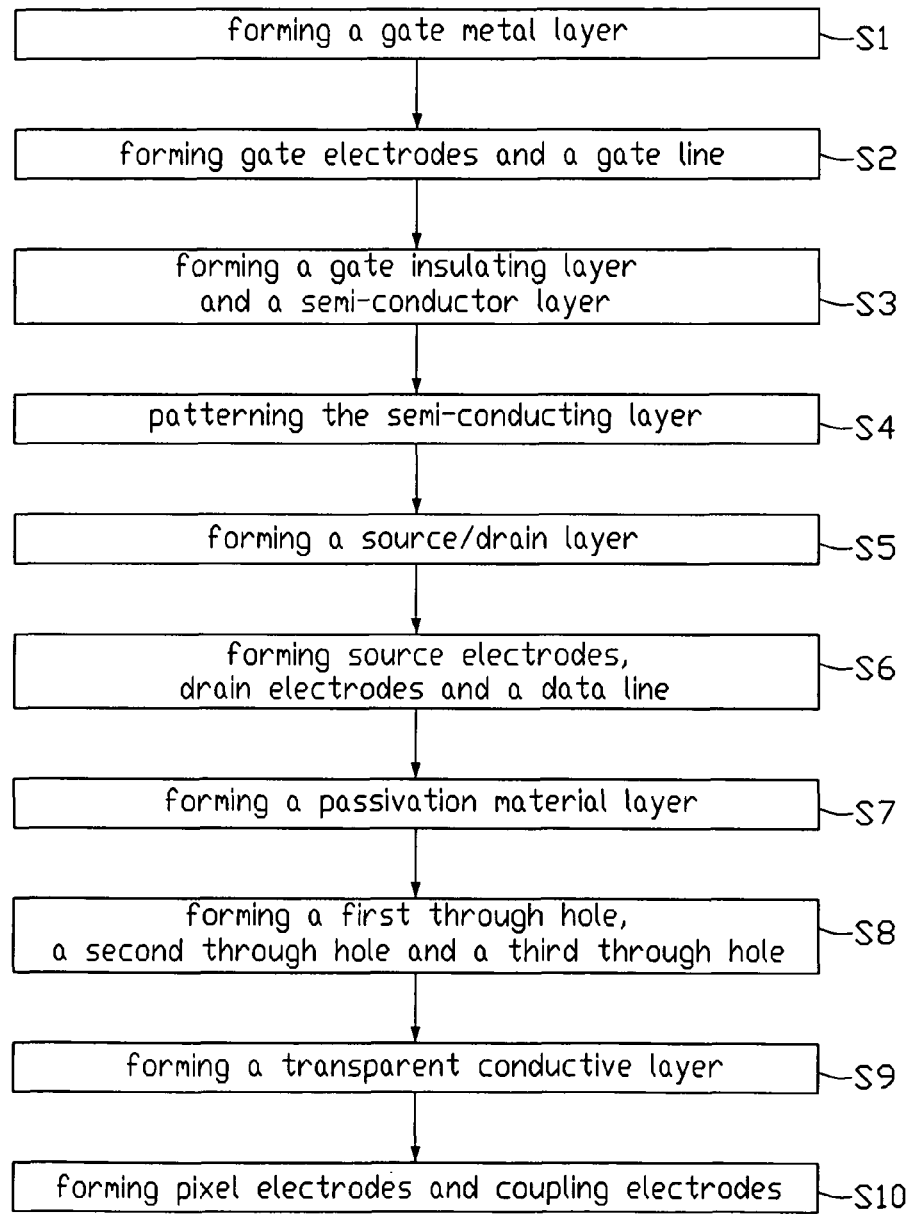
FIG. 8 is a flowchart of one embodiment of a method for fabricating the TFT substrate assembly of FIG. 2.

Referring to FIG. 8, one embodiment of a method of manufacturing the TFT substrate assembly 220 is shown. Depending on the embodiment, ordering of the blocks may be changed, blocks may be added, and others removed.

In block S1, the second transparent substrate 288 is provided. The second transparent substrate 288 may be made from glass or quartz. A gate metal layer and a first photo-resistor layer are formed on second transparent substrate 288.

In block S2, the first photo-resistor layer is exposed by a first photo-mask. The first photo-mask is then developed forming a first photo-resistor pattern. The gate metal layer is etched so as to form a pattern of the gate electrodes 2231, 2241 and the gate lines 221 that corresponds to the first photo-resistor pattern. The residual first photo-resistor layer is then removed by an acetone solution, in one embodiment.

In block S3, a gate insulating layer 281, a semi-conductor layer 282, and a second photo-resistor layer are sequentially formed on the substrate having the gate electrodes 2231, 2241 and the gate lines 221.

In block S4, the second photo-resistor layer is exposed by a second photo-mask. The second photo-mask is developed so as to form a second photo-resistor pattern. The semiconductor layer 282 is etched and patterned, forming a channel accordingly. The residual second photo-resistor layer is then removed by an acetone solution, in one embodiment.

In block S5, a source/drain metal layer and a third photo-resistor layer are sequentially formed on the semi-conductor layer 282.

In block S6, the third photo-resistor layer is exposed by a third photo-mask. The third photo-mask is developed so as to form a third photo-resistor pattern. The source/drain metal layer is etched so as to form a pattern of the source electrodes 2232, 2242, the drain electrodes 2233, 2243, and the data lines 222, which corresponds to the third photo-resistor pattern. The residual third photo-resistor layer is then removed by an acetone solution, in one embodiment.

In block S7, a passivation layer 283 and a fourth photo-resistor layer are sequentially formed on the source electrodes 2232, 2242, the drain electrodes 2233, 2243, and the data lines 222 formed thereon.

In block S8, the fourth photo-resistor layer is exposed by a fourth photo-mask. The fourth photo-mask is developed so as to form a fourth photo-resistor pattern. The passivation layer 283 is etched to define the first through holes 291, the second through holes 292, and the third through holes 293. The residual fourth photo-resistor layer is then removed by an acetone solution, in one embodiment.

In block S9, a transparent conductive layer and a fifth photo-resistor layer are sequentially formed on the passivation layer 283.

In block S10, the fifth photo-resistor layer is exposed by a fifth photo-mask. The fifth photo-mask is developed so as to form a fifth photo-resistor pattern. The transparent conductive layer is etched so as to form a pattern of the pixel electrodes 227, 228 and the coupling electrodes 229, which corresponds to the fifth photo-resistor pattern. The residual fifth photo-resistor layer is then removed by an acetone solution, in one embodiment.

It may be understood that the developing of the photo-mask in the blocks in FIG. 8, in one embodiment, may be developed by "soft-baking" the photo-mask as so to remove moisture from the photo-mask.

The LCD 200 includes the coupling capacitors 226. Each of the coupling capacitors 226 makes the voltage of the second pixel electrode 228 less than the voltage of the first pixel electrode 227, and induces a voltage difference between the first pixel electrode 227 and the second pixel electrode 228. It may be understood that no other data lines from the plurality of data lines 222 are needed to apply a different voltage to the second pixel electrode 228. Each of the pixel region 20 of the LCD 200 only needs one data line from the plurality of data lines 222 to achieve 8-domain vertical alignment. An aperture of the LCD 200 is increased, and a cost of the TFT substrate assembly 220 is decreased.

Figure 9:
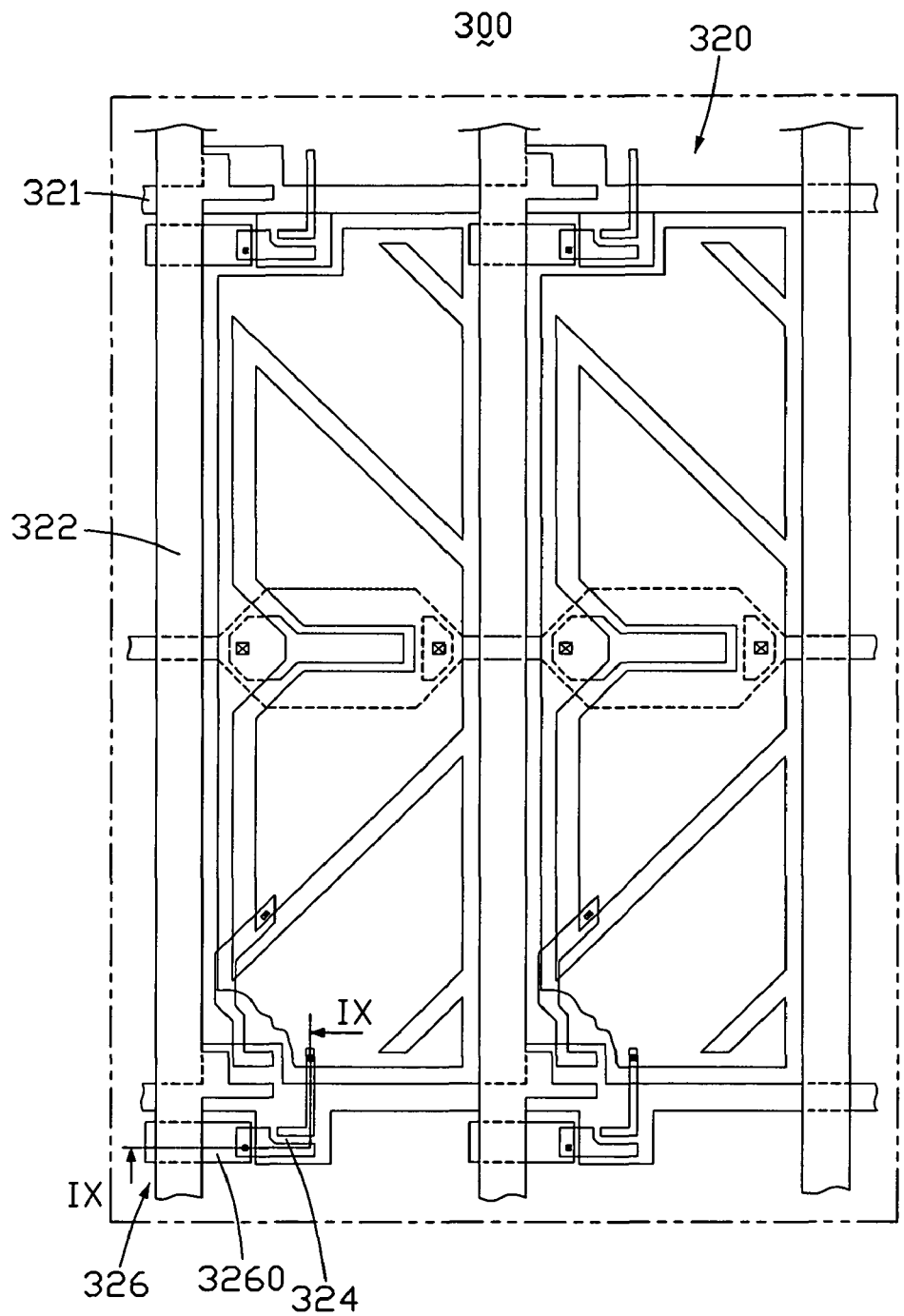
FIG. 9 is similar to FIG. 2, but showing a corresponding view in the case of a TFT substrate assembly of an LCD according to another embodiment of the present disclosure.
Figure 10:
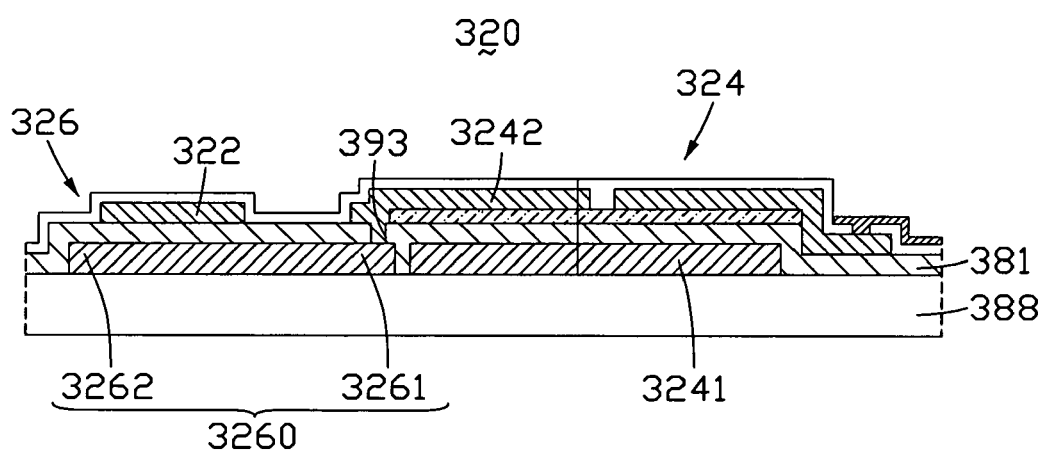
FIG. 10 is a schematic, side view of one embodiment of the TFT substrate assembly taken along line IX-IX of FIG. 8.

Referring to FIG. 9 and FIG. 10, FIG. 9 is a plan view of a TFT substrate assembly according to another embodiment of the present disclosure, and FIG. 10 is a side cross-sectional view of one embodiment of the TFT substrate assembly of FIG. 9 taken along line IX-IX. The LCD 300 is similar to the LCD 200; however, the TFT substrate assembly 320 of the LCD 300 includes a coupling electrode 3260. The coupling electrode 3260 is positioned between a transparent substrate 388 and a gate insulating layer 381. The coupling electrode 3260 includes a first part 3261 and a second part 3262. The first part 3261 is electrically connected with a second source electrode 3242 of a second TFT 324 via a third connecting hole 393. The second part 3262 overlaps with a part of a data line 322. The second part 3262 of the coupling electrode 3260, the corresponding part of the data line 322, and the gate insulating layer 381 positioned therebetween cooperatively form a coupling capacitor 326. A gate line 321 and a gate electrode 3241 of the second TFT 324 are made from opaque metal materials in a same manufacturing process. A second pixel electrode 328 is connected with the second TFT 324. Depending on the embodiment, the metal material can be made from one or more elements comprising aluminum, molybdenum, chromium, tantalum, and copper.

Figure 11:
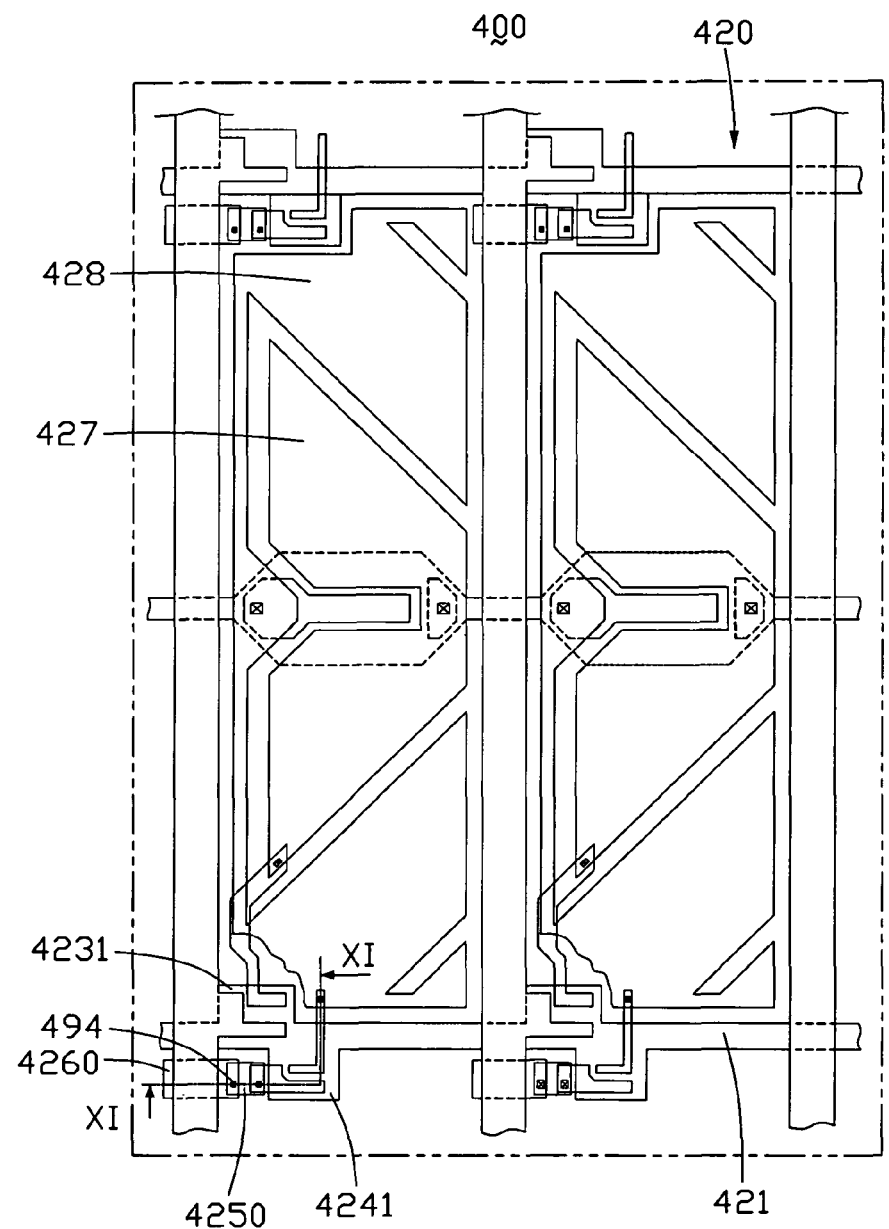
FIG. 11 is similar to FIG. 2, but showing a corresponding view in the case of a TFT substrate assembly of an LCD according to a another embodiment of the present disclosure.
Figure 12:
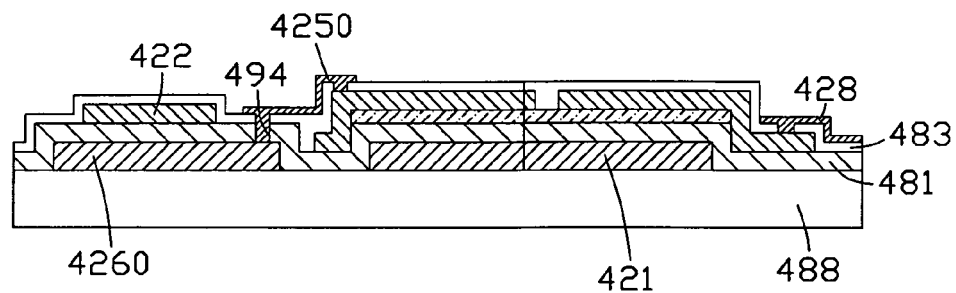
FIG. 12 is a schematic, side view of one embodiment of the TFT substrate assembly taken along line XI-XI of FIG. 10.

Referring to FIG. 11 and FIG. 12, FIG. 11 is a plan view of a TFT substrate assembly of an LCD according to another embodiment of the present disclosure, and FIG. 12 is a side view of the TFT substrate assembly taken along line XI-XI. The LCD 400 is similar to the LCD 200. However, the LCD 400 includes a first coupling electrode 4260 and a second coupling electrode 4250. The first coupling electrode 4260 is positioned between a transparent substrate 488 and a gate insulating layer 481. The second coupling electrode 4250 is positioned on a passivation layer 483. The first coupling electrode 4260 is electrically connected with the second coupling electrode 4250 via a fourth connecting hole 494 in the gate insulating layer 481 and the passivation layer 483. At least one of the first coupling electrode 4260 and the second coupling electrode 4250 overlaps with the data line 422 to form at least one coupling capacitor.

The LCD 400 includes the first coupling electrode 4260 and the second coupling electrode 4250. An overlapping area of the coupling electrodes 4250, 4260 and the data line 422 can be designed according to desired requirements. That is, a voltage difference between a first pixel electrode 427 and a second pixel electrode 428 can be designed in a large arrangement.

A manufacturing method of the LCD 400 is similar to the manufacturing method of the LCD 200. However, the first coupling electrode 4260, a first gate electrode 4231, a second gate electrode 4241, and a gate line 421 are made from a metal layer in a same manufacturing process.

Figure 13:
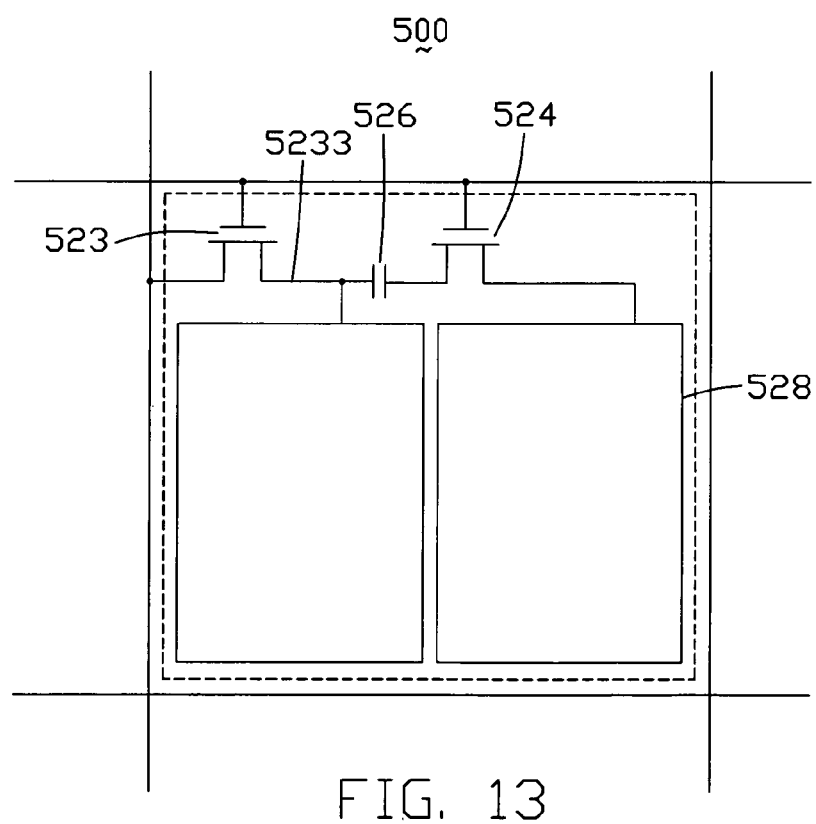
FIG. 13 is similar to FIG. 5, but showing a corresponding circuit diagram of a pixel region of an LCD according to another embodiment of the present disclosure.

Referring to FIG. 13, a circuit diagram of a pixel unit of an LCD according to another embodiment of the present disclosure is shown. The LCD is 500 similar to the LCD 200. However, a second pixel electrode 528 is electrically connected with a drain electrode 5233 of a first TFT 523 via a second TFT 524 and a coupling capacitor 526 connected in series.

Figure 14:
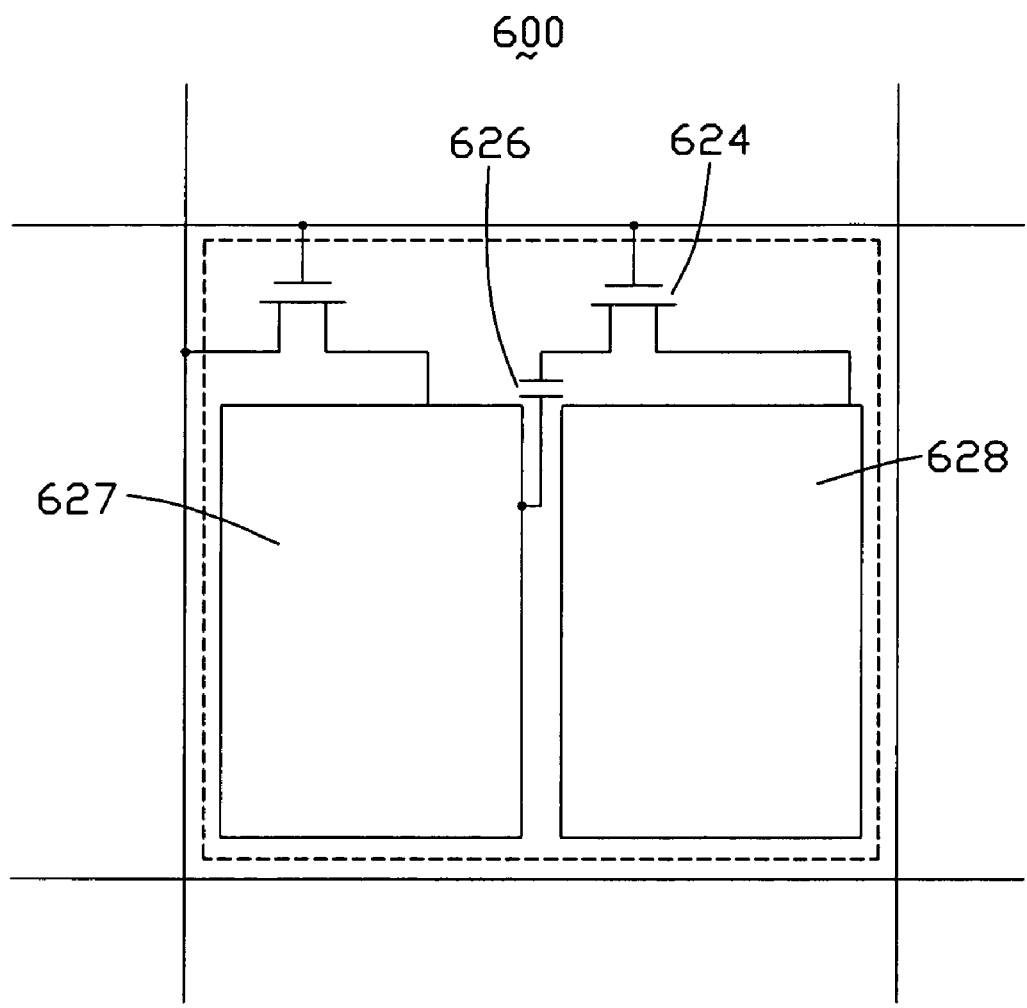
FIG. 14 is similar to FIG. 6, but showing a corresponding circuit diagram of a pixel region of an LCD according to a another embodiment of the present disclosure.

Referring to FIG. 14, a circuit diagram of an LCD according to another embodiment of the present disclosure is shown. The LCD 600 is similar to the LCD 200. However, a second pixel electrode 628 is electrically connected with a first pixel electrode 627 via a second TFT 624 and a coupling capacitor 626 connected in series.

Figure 15:
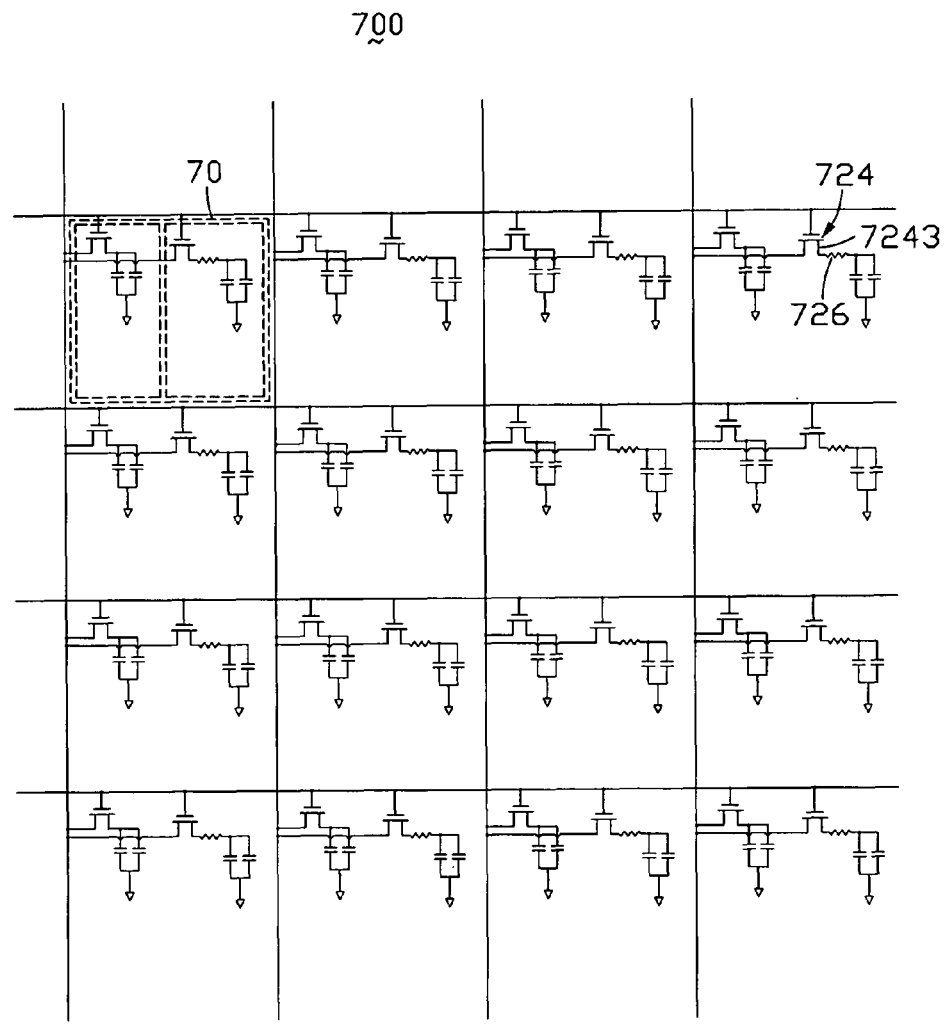
FIG. 15 shows a corresponding circuit diagram of an LCD according to a another embodiment of the present disclosure, the LCD including a plurality of pixel regions.
Figure 16:
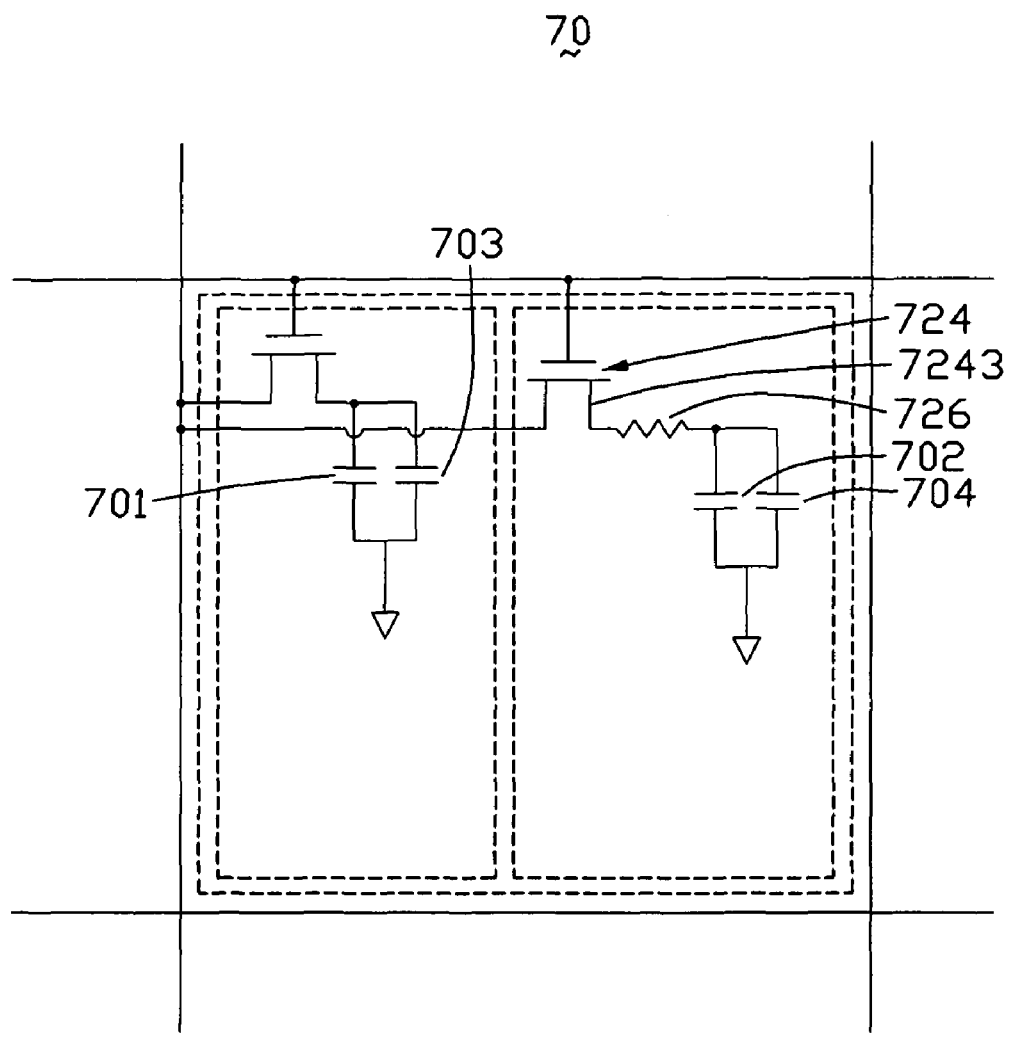
FIG. 16 illustrates one embodiment of a corresponding circuit diagram of one of the pixel regions of FIG. 14.

Referring to FIG. 15 and FIG. 16, FIG. 15 is a circuit diagram of an LCD according to another embodiment of the present disclosure, FIG. 16 is an circuit diagram of a pixel region of the LCD. The LCD 700 is similar to the LCD 200. However, the LCD 700 includes a voltage dividing resistor 726 connecting a drain electrode 7243 of a second TFT 724 instead of a coupling capacitor. The voltage dividing resistor 726 has high impedance, and can be made from semi-conductor materials. The pixel region 70 includes a common electrode (not labeled), a first pixel electrode (not labeled), a second pixel electrode (not labeled) and a plurality of liquid crystal molecules (not labeled) sandwiched between the pixel electrodes and the common electrode. The common electrode, the first pixel electrode and the liquid crystal molecules cooperatively form a first liquid crystal capacitor 701. The common electrode, the second pixel electrode and the liquid crystal molecules cooperatively form a second liquid crystal capacitor 702. The pixel region 70 further includes a first storing capacitor 703 in parallel connected with the first liquid crystal capacitor 701, and a second storing capacitor 704 in parallel connected with the second liquid crystal capacitor 702.

Figure 17:
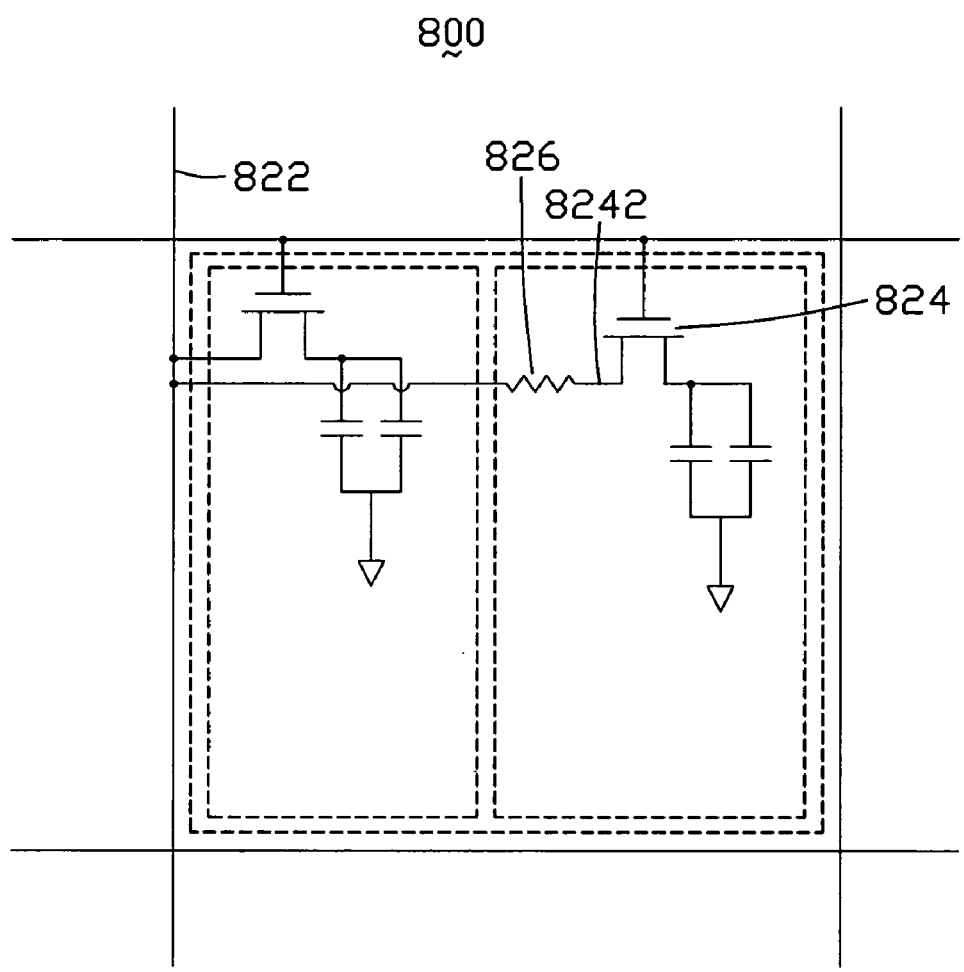
FIG. 17 is similar to FIG. 5, but showing a corresponding circuit diagram of a pixel region of an LCD according to another embodiment of the present disclosure.
Figure 18:
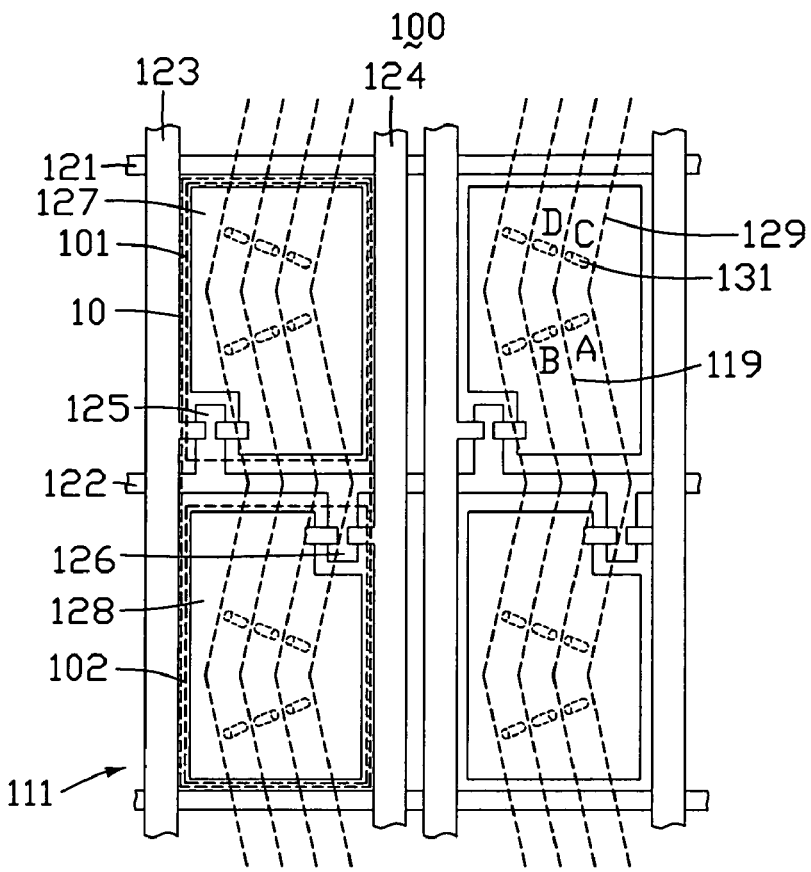
FIG. 18 is a top plan view of an LCD device, the LCD device including a plurality of first sub-pixel regions, a plurality of second sub-pixel regions, and a plurality of liquid crystal molecules.
Figure 19:
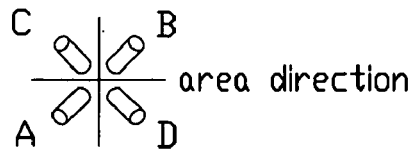
FIG. 19 is a top-down view of orientations of four of the liquid crystal molecules of FIG. 18.
Figure 20:
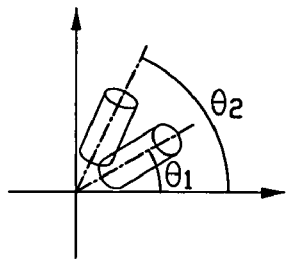
FIG. 20 is a schematic, side view of one of the liquid crystal molecules in the first sub-pixel region and one of the liquid crystal molecules in the second sub-pixel region of FIG. 18, the liquid crystal molecules having different tilt angle.

Referring to FIG. 17, an circuit diagram of an LCD according to another embodiment of the present disclosure is shown. The LCD 800 is similar to the liquid crystal display 700. However, a second source electrode 8242 of a second TFT 824 is connected with a data line 822 via a voltage dividing resistor 826.

It may be understood that alternative embodiments may include one or more of the following connections, elements, and/or sizes. In a first example, a second source electrode of the second TFT 724 is connected with a first drain electrode of the first TFT instead of a data line.

In a second example, the second pixel electrodes 228, 328, 428, 528, 628 may be connected with the second drain electrodes of the second TFTs 224, 324, 424, 524, 624 via a coupling electrode, and the second source electrodes of the second TFTs 224, 324, 424, 524, 624 are connected with the data lines, or the drain electrodes of the first TFTs, or the first pixel electrodes. The second pixel electrodes 228, 328, 428, 528, 628 may be connected with the drain electrodes of the second TFTs 224, 324, 424, 524, 624, and the source electrodes of the second TFTs 224, 324, 424, 524, 624 may be connected with the data lines, or the drain electrodes of the first TFTs, or the first pixel electrodes.

In a third example, a channel width/length ratio of first TFTs may be different from a channel width/length ration of second TFTs.

In a fourth example, first TFTs and second TFTs may be top gate TFTs or bottom gate TFTs, and first TFTs and second TFTs may be symmetrical-typed or anisomerous-typed.

In a fifth example, any voltage dividing elements may be used to replace the coupling electrodes or the voltage dividing resistor.

It is believed that the present embodiments and their advantages will be understood from the foregoing description, and it will be apparent that various changes may be made thereto without departing from the spirit or scope of the present disclosure or sacrificing all of its material advantages, the examples hereinbefore described merely being preferred or exemplary embodiments of the present disclosure.

What is claimed is:

1. A thin film transistor (TFT) substrate assembly comprising:
   a substrate;
   a plurality of gate lines disposed on the substrate;
   a plurality of data lines orthogonal to the gate lines, the plurality of gate lines and the plurality of data lines defining a plurality of pixel regions;
   each pixel region comprising a first TFT, a second TFT, a first pixel electrode, and a second pixel electrode, a gate electrode of the first TFT and a gate electrode of the second TFT in one pixel region being electrically connected with a same corresponding gate line from the plurality of gate lines, wherein the first pixel electrode is electrically connected with a drain electrode of the first TFT, the second pixel electrode is electrically connected with a drain electrode of the second TFT, a source electrode of the first TFT is directly electrically connected with a corresponding data line from the plurality of data lines, a source electrode of the second TFT is electrically connected with the corresponding data line from the plurality of data lines via a voltage dividing element, and the voltage dividing element is a coupling capacitor.

2. The TFT substrate assembly of claim 1, wherein each pixel region further comprises a first coupling electrode, the first coupling electrode is electrically connected with the second TFT, the first coupling electrode overlaps with a part of the corresponding data line from the plurality of data lines, and the first coupling electrode and the part of the data line cooperatively form the coupling capacitor.

3. The TFT substrate assembly of claim 2, further comprising a passivation layer, and a gate insulating layer positioned between the substrate and the passivation layer; the gate lines and the gate electrodes of the first TFTs and second TFTs located between the gate insulating layer and the substrate; the data lines, the source electrodes and the drain electrodes of the first TFTs and second TFTs located between the gate insulating layer and the passivation layer; and the first coupling electrodes and the first and second pixel electrodes located on the passivation layer.

4. A liquid crystal display comprising:
a first substrate assembly;
a second substrate assembly parallel to the first substrate assembly; and
a liquid crystal layer positioned between the first substrate assembly and the second substrate assembly,
the first substrate assembly comprising:
  a substrate;
  a plurality of gate lines;
  a plurality of data lines; and
  a plurality of pixel regions;
    each pixel region comprising a first TFT, a second TFT, a first pixel electrode, and a second pixel electrode, the first TFT and the second TFT applied with a same scanning signal, wherein gate electrodes of the first TFT and the second TFT in one pixel region are connected with a same corresponding gate line from the plurality of gate lines, the first pixel electrode is electrically connected with a drain electrode of the first TFT, the second pixel electrode is electrically connected with a drain electrode of the second TFT, a source electrode of the first TFT is directly electrically connected with a corresponding data line from the plurality of data lines, a source electrode of the second TFT is electrically connected with the corresponding data line from the plurality of data lines via a voltage dividing element, and the voltage dividing element is a coupling capacitor.

5. The liquid crystal display of claim 4, wherein each pixel region further comprises a first coupling electrode, the first coupling electrode is electrically connected with the second TFT, the first coupling electrode overlaps with a part of the corresponding data line from the plurality of data lines, and the first coupling electrode and the part of the data line cooperatively form the coupling capacitor.

6. The liquid crystal display of claim 5, further comprising a passivation layer, and a gate insulating layer positioned between the substrate and the passivation layer; the gate lines and the gate electrodes of the first TFTs and second TFTs located between the gate insulating layer and the substrate; the data lines, the source electrodes and the drain electrodes of the first TFTs and second TFTs located between the gate insulating layer and the passivation layer; and the first coupling electrodes and the first and second pixel electrodes located on the passivation layer.

7. A liquid crystal display comprising:
a plurality of gate lines; and
a plurality of data lines disposed with the gate lines, wherein two adjacent gate lines and two adjacent data lines define a pixel region, each pixel region is divided into a first sub-pixel region and a second sub-pixel region, each first sub-pixel region comprises a first TFT and a first pixel electrode, each second sub-pixel region comprises a second TFT, a second pixel electrode and a voltage dividing element, the first TFT and the second TFT are applied with a same scanning signal, gate electrodes of the first TFT and the second TFT in one pixel region are connected with a same corresponding gate line from the plurality of gate lines, the first pixel electrode is electrically connected with a drain electrode of the first TFT, the second pixel electrode is electrically connected with a drain electrode of the second TFT, a source electrode of the first TFT is directly electrically connected with a corresponding data line from the plurality of data lines, a source electrode of the second TFT is electrically connected with the corresponding data line from the plurality of data lines via a corresponding voltage dividing element in the second sub-pixel region, and the voltage dividing element is a coupling capacitor.

8. The liquid crystal display of claim 7, wherein each pixel region comprises a first coupling electrode, the first coupling electrode is electrically connected with the second TFT, the first coupling electrode overlaps with a part of the corresponding data line from the plurality of data lines, and the first coupling electrode and the part of the data line cooperatively form the coupling capacitor.

9. The liquid crystal display of claim 8, further comprising a passivation layer, and a gate insulating layer positioned between the substrate and the passivation layer; the gate lines and the gate electrodes of the first TFTs and second TFTs located between the gate insulating layer and the substrate; the data lines, the source electrodes and the drain electrodes of the first TFTs and second TFTs located between the gate insulating layer and the passivation layer; and the first coupling electrodes and the first and second pixel electrodes located on the passivation layer.

* * * * *